United States Patent [19]

Stowers et al.

[11] Patent Number: 4,571,540

[45] Date of Patent: * Feb. 18, 1986

[54] ELECTRICAL CONTACT PROBE

[75] Inventors: Jeffery P. Stowers, Mt. Sidney; Thomas W. Moore, Fisherville, both of Va.

[73] Assignee: Virginia Panel Corporation, Waynesboro, Va.

[*] Notice: The portion of the term of this patent subsequent to Nov. 22, 2000 has been disclaimed.

[21] Appl. No.: 532,009

[22] Filed: Sep. 14, 1983

[51] Int. Cl.$^4$ .............................................. G01R 1/06
[52] U.S. Cl. ................................ 324/158 P; 324/72.5
[58] Field of Search ............... 324/158 P, 158 F, 72.5, 324/149; 339/108 TP

[56] References Cited

U.S. PATENT DOCUMENTS 4,105,970  8/1978  Katz ................................ 324/158 P
4,417,206  11/1983  Stowers ........................... 324/158 P Primary Examiner—Stewart J. Levy
Assistant Examiner—Stephen M. Baker
Attorney, Agent, or Firm—B. P. Fishburne, Jr.

[57] ABSTRACT

An electrical contact probe is produced by four passes of a profiled machining cutter across the longitudinal axis of the probe at circumferentially equidistantly spaced points and with the machining cutter on each pass traveling on a linear path disposed at an acute angle to the longitudinal axis of the probe. The contact probe so produced has a long pyramid center point surrounded concentrically by eight modified pyramid points in two levels or heights. The shortest level points are arranged in alternating relation with the other points surrounding the center point and all of the surrounding points are of lesser height than the center point.

7 Claims, 6 Drawing Figures

U.S. Patent  Feb. 18, 1986  4,571,540
FIG.1
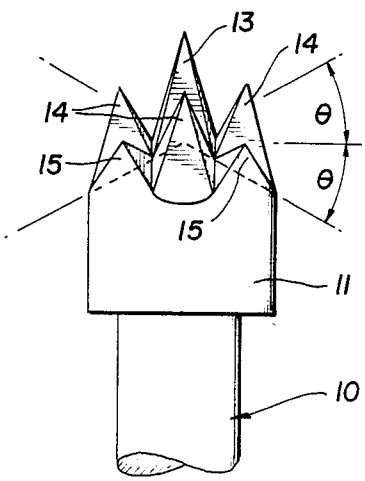
FIG.2
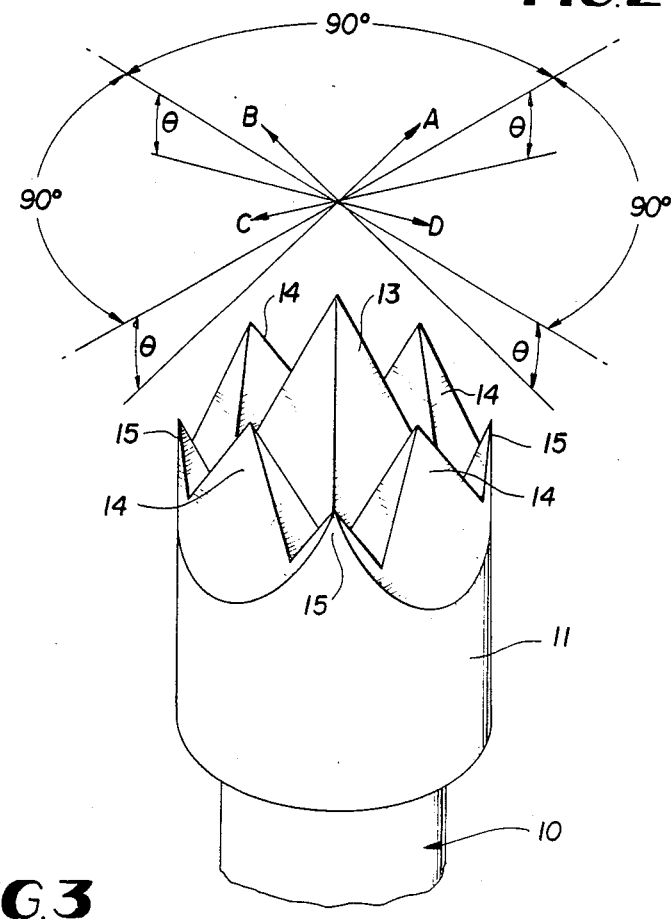
FIG.3
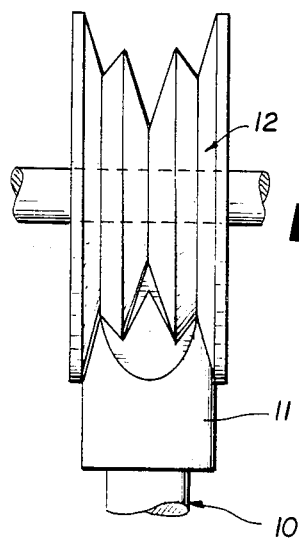
FIG.4
FIG.5
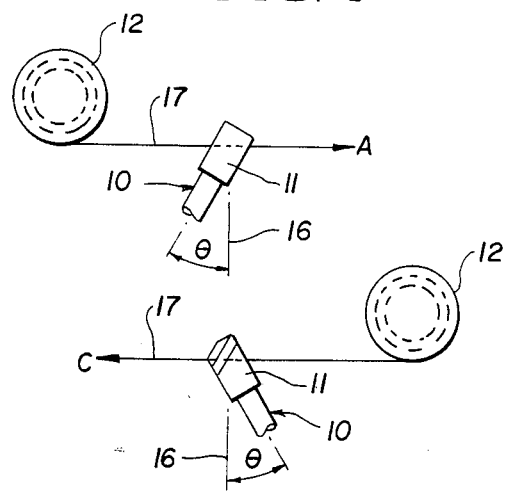
FIG.6
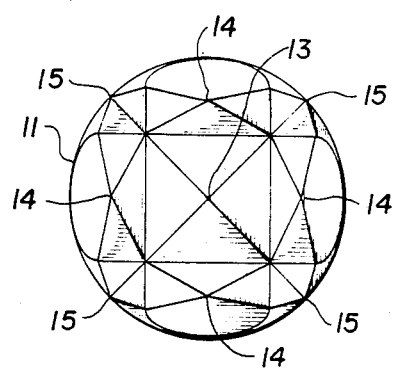

ELECTRICAL CONTACT PROBE

CROSS-REFERENCE TO RELATED APPLICATION

This application contains subject matter in common with Ser. No. 241,681, filed Mar. 9, 1981, for Electrical Contact Probe and Method of Manufacturing, now U.S. Pat. No. 4,417,206.

BACKGROUND OF THE INVENTION

In the prior patent application, an electrical contact probe is disclosed having a center pyramid point surrounded concentrically by a plurality of axially shorter chisel points intervened circumferentially by an equal number of contact points having equal lengths. The contact probe in the prior application is produced by two passes of a profiled machining cutter moving on orthogonal paths at right angles to the longitudinal axis of the probe.

It has been discovered that a superior electrical contact probe without chisel points and possessing only pyramid and modified pyramid points in three levels or heights can be produced with the identical machining cutter of the prior application. The result is obtained by causing the profiled cutter to make four passes across the longitudinal axis of the probe at four circumferentially equidistantly spaced points and with the machining cutter during each pass traveling a linear path arranged at an acute angle to the longitudinal axis of the probe.

The resulting electrical contact probe, after machining, includes a center leading pyramid point surrounded concentrically by four circumferentially equidistantly spaced modified pyramid points of equal but lesser height than the central point, and with four more modified pyramid points of still lesser height disposed in alternating spaced relationship between the aforementioned modified pyramid points.

Other objects and advantages of the invention will become apparent to those skilled in the art during the course of the following detailed description.

BRIEF DESCRIPTION OF THE DRAWINGS

FIG. 1 is a side elevation of an electrical contact probe in accordance with the present invention.

FIG. 2 is an enlarged perspective view of the contact probe with an accompanying machining schematic.

FIG. 3 is a side elevation of the probe being machined by a profiled machining cutter.

FIG. 4 is a partly schematic view of a probe blank and machining cutter prior to the first machining pass.

FIG. 5 is a similar view of the blank and cutter subsequent to the first machining pass and prior to the second pass.

FIG. 6 is an end view of the finished probe shown in FIGS. 1 and 2.

DETAILED DESCRIPTION

Referring to the drawings in detail wherein like numerals designate like parts, an electrical contact probe 10 according to the present invention has an initially cylindrical head 11, FIG. 4, before machining. Following machining by a profiled machining cutter 12 which is the identical cutter disclosed in the referenced prior patent application, the contact probe is constructed as follows.

On the leading end of the originally cylindrical head 11, a single central long leading pyramid point 13 is formed, surrounded by eight circumferentially spaced modified pyramid points in two heights or levels, all shorter than the central point 13. One group of modified pyramid points designated by the numeral 14 are four in number and are equidistantly spaced circumferentially around the central pyramid point 13. The points 14 have equal heights which are less than the height of the central point 13. The points 14 are located directly opposite the convergent flat triangular faces of the central pyramid point 13.

The other four contact points 15 of lesser height than the points 14 are equidistantly spaced circumferentially and disposed midway between adjacent pairs of points 14, in radial alignment with the inclined convergent edges of the central pyramid point 13. The points 15 are also of modified pyramid form and no chisel-like points are formed on the contact probe. A total of nine pyramid and modified pyramid points are thus provided in three distinct levels or heights including the single leading central pyramid point 13.

The procedure for machining the cylindrical head 11 with four linear passes of the profiled machining tool 12 is schematically illustrated in FIGS. 1 and 2 and graphically shown in FIGS. 4 and 5. With reference to FIGS. 1 and 2, as previously stated, the profiled machining tool or cutter is fed on four circumferentially equidistantly spaced (90°) linear paths and at an angle $\theta$, preferably 35°, to a plane perpendicular to the central longitudinal axis of the contact probe 10. These four passes of the machining cutter across the cylindrical head 11, without any other machining operations, completely forms the array of points 13, 14 and 15 in three levels or heights, as described.

In practice, as illustrated in FIGS. 4 and 5, the head 11 is fixedly held during each pass of the profiled cutter 12 with its axis at the angle $\theta$ relative to an axis 16 which is perpendicular to the linear path 17 of the profiled cutter 12. Following each pass of the cutter across the inclined cylindrical head 11, such head is indexed 90° on its axis in preparation for the next machining cutter pass and the head is also shifted or swung to the opposite side of axis 16 so as to assume the angle $\theta$ on the opposite side of the axis 16.

The first machining pass A is illustrated in FIG. 4 and the second or reverse machining pass C is illustrated in FIG. 5 after the indexing of the head 11 and the establishment of the angle $\theta$ on the opposite side of the axis 16.

The result of the first cutter pass is shown on the head 11 in FIG. 5. The procedures of FIGS. 4 and 5 are repeated identically during the third and fourth passes of the cutter 12 across the head 11 to complete the formation of the electrical contact probe with the nine pyramid and modified pyramid points 13, 14 and 15 in three levels or heights on the leading end of the probe head 11, as completely described previously herein. All of the side faces of the pyramid and modified pyramid points 13, 14 and 15 converge at a single point so that no chisel-like elements are produced on the contact probe according to the present invention.

The advantages from a functional standpoint of having the electrical contact probe provided with the arrangement of multiple contact points according to this invention are known to those skilled in the art to which the invention relates.

It is to be understood that the form of the invention herewith shown and described is to be taken as a preferred example of the same, and that various changes in the shape, size and arrangement of parts may be resorted to, without departing from the spirit of the invention or scope of the subjoined claims.

We claim:

1. An electrical contact probe comprising a cylindrical leading end portion, a center leading pyramid contact point on the cylindrical portion having four triangular side faces, and a plurality of modified pyramid contact points surrounding the center leading pyramid point concentrically, the modified pyramid points being in two circumferentially alternating groups and having two heights, both heights being less than the height of the center leading pyramid point and the heights of the modified pyramid points in one group being less than the heights of the modified pyramid points in the other group, the heights of the points in each said group being the same, and the faces of each modified pyramid point converging at a single point.

2. An electrical contact probe as defined in claim 1, and the modified pyramid points in one said group being disposed in radially spaced opposed relationship to the triangular side faces of the center leading pyramid point, and the modified pyramid points of the other said group being in radially spaced aligned relationship with the convergent edges of the center leading pyramid point.

3. An electrical contact probe as defined in claim 2, and the modified pyramid points which are in aligned relationship with the convergent edges of the center leading pyramid point being the points of the group having the least height in relation to the center leading pyramid point.

4. An electrical contact probe having a leading end, a center leading pyramid contact point on said leading end of the probe, and a plurality of circumferentially spaced substantially pyramid points surrounding the center leading pyramid point in concentric spaced relationship thereto, the surrounding substantially pyramid points all being of lesser height than the center leading pyramid point, and alternating substantially pyramid points of said surrounding plurality all being of one height which is less than the heights of the remaining alternating substantially pyramid points in said plurality and the latter being of one height, and the faces of each substantially pyramid point converging at a single point.

5. An electrical contact probe as defined in claim 4, and said plurality of surrounding substantially pyramid points being eight in number with said alternating points of least height being aligned radially with the convergent edges of the center leading pyramid point and the other substantially pyramid points of the surrounding plurality being aligned radially with the triangular side faces of the center leading pyramid point.

6. An electrical contact probe as defined in claim 4, and said leading end of the contact probe carrying all of said points being cylindrical.

7. An electrical contact probe having on its leading end a comparatively long central pyramid contact point, surrounded in spaced concentric relationship by four substantially pyramid contact points of equal heights which are less than the height of the central contact point and which are radially opposite the triangular side faces of the central contact point, and the central contact point being further surrounded concentrically in radially spaced relationship by four additional substantially pyramid equal height contact points whose heights are less than the heights of the first-mentioned surrounding contact points, and the last-mentioned contact points being aligned radially with the convergent edges of the central pyramid contact point, and the faces of each substantially pyramid contact point converging at a single point.

* * * * *